United States Patent [19]

Zschauer

[11] 4,410,993
[45] Oct. 18, 1983

[54] LASER DIODE

[75] Inventor: Karl-Heinz Zschauer, Grafing, Fed. Rep. of Germany

[73] Assignee: Siemens Aktiengesellschaft, Berlin & Munich, Fed. Rep. of Germany

[21] Appl. No.: 255,329

[22] Filed: Apr. 17, 1981

[30] Foreign Application Priority Data

Apr. 30, 1980 [DE] Fed. Rep. of Germany ....... 3016778

[51] Int. Cl.³ .............................................. H01S 3/19
[52] U.S. Cl. ...................................... 372/44; 357/17; 372/45
[58] Field of Search ............... 372/43, 44, 45; 357/16, 357/17, 61

[56] References Cited

U.S. PATENT DOCUMENTS 4,220,960 9/1980 Liu et al. ............................... 372/43

OTHER PUBLICATIONS

Smith et al., "Lattice Matched Double Heterojunction . . ." *IBM Technical Disclosure Bulletin*, vol. 16, No. 11, Apr. 1974, pp. 3808–3809.
D. R. Scifres et al., "Branching Waveguide Coupler in a GaAs/GaAlAs Injection Laser", *Appl. Phys. Lett.* 32(10), May 15, 1978, pp. 658–661.
F. Stern et al., "Photon Recycling in Semiconductor Lasers", *J. App. Physics*, vol. 45, Sep. 1979, pp. 3904–3906.
H. C. Casey Jr., et al., "Hetrostructure Lasers" Part A, Fundamental Principles, Academic Press, New York, 1978 pp. 191–193.

Primary Examiner—James W. Davie
Attorney, Agent, or Firm—Hill, Van Santen, Steadman & Simpson

[57] ABSTRACT

A multi-layer laser diode structure comprised of a semiconductor material, for example, gallium-aluminum-arsenide, having varying amounts of a dopant, such as aluminum, in the respective layers, includes a cover layer which is transparent to laser radiation and provided for total reflection of radiation generated in a laser-active layer positioned below the cover layer and an additional layer positioned on top of the cover layer and supporting a contact on its exterior surface. The additional layer is composed of a semiconductor material having a band gap which is greater by at least 2 kT relative to that of the material forming the laser-active layer. The exterior surface of the additional layer is substantially specularly smooth for radiation generated in the laser-active layer. Non-destructive testing of quality factors decisive for a completed laser diode can occur with this type of construction.

6 Claims, 2 Drawing Figures

LASER DIODE

BACKGROUND OF THE INVENTION

1. Field of the Invention

The invention relates to laser diodes and somewhat more particularly to multi-layered laser diode structures having a cover layer transparent to laser radiation for total reflection of radiation produced in a laser-active layer positioned below the cover layer and having an additional layer positioned on top of the cover layer for supporting a contact thereon.

2. Prior Art

Laser diodes having a multi-layer structure composed of epitaxially deposited layers positioned on top of one another on a gallium-arsenide semiconductor substrate are known. Such multi-layer structures contain a laser-active layer comprised of a gallium arsenide material in which, during current passage, a repopulation necessary for generation of coherent laser radiation is produced.

Because of the necessarily high current densities required for laser diodes, precautions must be exercised during diode construction to insure that threshold current density for laser operation is low and that a good junction contact is present. Both of these conditions lead to a selection of a multi-layer structure having a laser-active layer comprised of a gallium arsenide material, preferably containing a given aluminum concentration, sandwiched between two other layers composed of gallium-aluminum-arsenide. The aluminum concentration in these gallium-aluminum-arsenide layers is, for example, about 35 mol % whereas the aluminum concentration in the laser-active layer is, for example, about 8 mol %. In this manner, the gallium-aluminum-arsenide layers exhibit a refractive step or jump of $n_1/n_2 \neq 1$ (wherein $n_1$ is the refractive index of the gallium arsenide material in the laser-active layer and $n_2$ is the refractive index of the gallium-aluminum-arsenide in the two adjoining layers) sufficient for total reflection.

The thickness of the layers sandwiched about the laser-active layer is on the order of magnitude of 1 to 5 times, typically 3 times, the size of the wavelength of the laser radiation generated in the gallium-aluminum-arsenide material.

The typical construction of a laser diode described above includes a substrate, a first layer positioned on the substrate and comprised of gallium-aluminum-arsenide, containing, for example, about 35 mole % aluminum, a laser-active layer positioned on the first layer and comprised of gallium-aluminum-arsenide, containing, for example, about 8 mol % aluminum and a further layer positioned on the laser-active layer and composed of gallium-aluminum-arsenide, similar in composition to that of the first layer.

Since it is possible to apply contacts having satisfactory conductive properties only with difficulty on a gallium-aluminum-arsenide layer having a relatively high aluminum concentration therein, as on the above described further or cover layer (i.e., positioned on top of the laser-active layer), it is common to position an additional layer on top of such further layer. Such additional layer is composed of a gallium-arsenide material and has a substantially smooth exterior surface on which a contact is applied. The gallium arsenide material typically utilized for such additional layer has a high absorption coefficient for a wavelength range in which the generated radiation lies.

During the manufacture of laser diodes, an additional problem arises of being able to ascertain or monitor, during the manufacturing process, whether a given substrate disc for supporting the earlier described four epitaxially-applied layers has such qualities from piece-to-piece and/or charge-to-charge, particularly a high capability for radiation generation and/or a low degree of radiation-free transmission, that the subsequent manufacturing steps are still economically desirable.

SUMMARY OF THE INVENTION

The invention provides an improved multi-layer laser diode structure of the type earlier described wherein monitoring of quality factors decisive for a laser diode can occur during the manufacturing process via a destruction-free testing. In the practice of the invention, a supplied substrate disk having four different epitaxial layers applied thereon can be checked by selective light excitation with generation of photoluminescence in the laser-active layer. In addition, the invention provides an additional layer of the type earlier described which is made transmissive to the monitoring light radiation by proper material selection. In this manner, destruction-free monitoring is attained.

In accordance with the principles of the invention, a laser diode comprised of a multi-layer structure having a cover layer transparent to laser radiation said layer being provided for total internal reflection of radiation generated in a laser-active layer positioned below and in contact with the cover layer, and having a contact positioned on an additional layer, which is positioned between such contact and the cover layer and in contact therewith, is improved by forming the additional layer from a semiconductor material having a band gap which is greater by at least 2 kT, and preferably at least 5 kT, relative to that of the material forming the laser-active layer and forming the exterior surface of such additional layer in such a manner that it is substantially specularly smooth for radiation generated in the laser-active layer.

In a preferred embodiment of the invention, a laser-active layer is composed of a material having the formula:

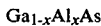

wherein x is a numeral greater than zero and the additional layer is composed of a material having the formula:

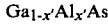

wherein x' is a numeral greater than 0.04 but smaller than the amount of aluminum in the cover layer located between such additional layer and the laser-active layer.

DESCRIPTION OF PREFERRED EMBODIMENTS

Figure 1:
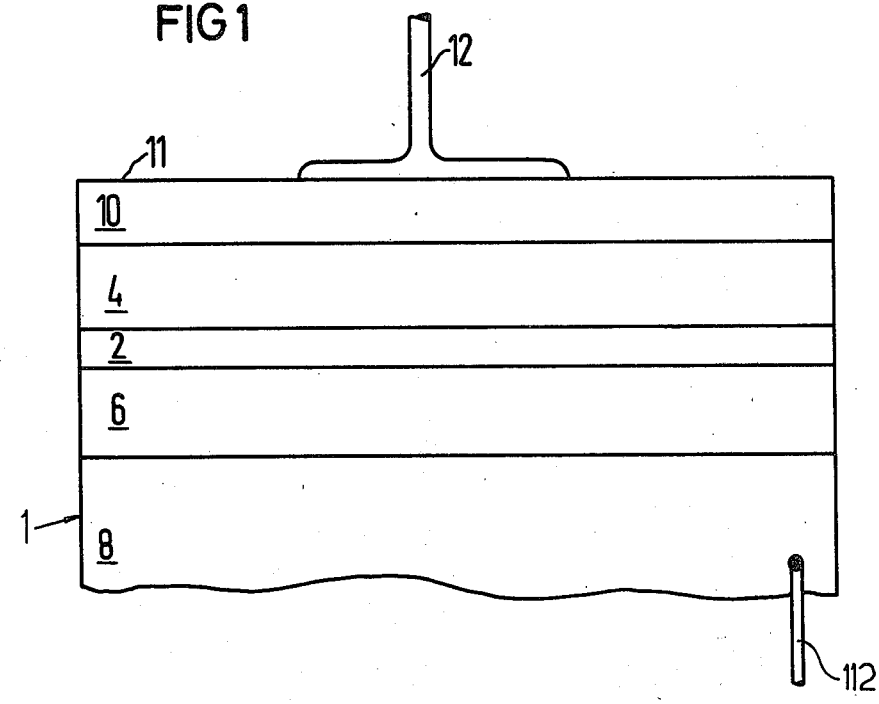
FIG. 1 is an elevated, partial, schematic view of a laser diode constructed in accordance with the principles of the invention.

In the drawings, like reference numerals refer to like elements.

A laser diode of the invention is comprised of a multi-layer structure 1 which includes a substrate 8, for example composed of gallium-aluminum-arsenide, having about 2 to 12 mol % aluminum therein. A first layer 6 is positioned on top of the substrate 8 and, for example, is composed of a gallium-aluminum-arsenide having about 25 to 40 mol % aluminum therein. A second or laser-active layer 2 is positioned on top of layer 6 and, for example, is composed of a gallium-aluminum-arsenide having about 6 to 8 mol % aluminum therein. A third or cover layer 4 is positioned on top of the laser-active layer 2 and is composed of, for example, a gallium-aluminum-arsenide having about 25 to 40 mol % aluminum therein, similar to that of layer 6. An additional or fourth layer 10 is positioned on top of layer 4 and is composed of, for example, a gallium-aluminum-arsenide having about 10 to 12 mol % of aluminum therein. The additional layer 10 has an substantially specularly smooth exterior surface 11 on which a contact 12 is mounted. The thickness of layers 6 and 4, as explained earlier, is in the order of magnitude of 1 to 5 times, typically 3 times, the size of the wavelength of the laser radiation in gallium-aluminum-arsenide material.

Figure 2:
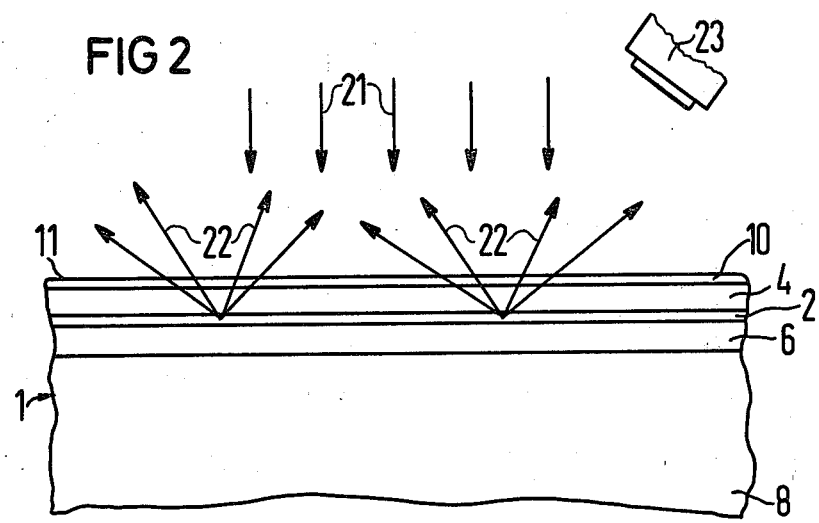
FIG. 2 is an elevated, partial, diagrammatic illustration of destruction-free monitoring of a laser diode constructed in accordance with the principles of the invention.

Referring now to FIG. 2, where a laser diode of the above construction is shown undergoing destruction-free testing, laser radiation 21 is schematically shown as irradiating onto the multi-layer structure 1, i.e., into the substrate disc having the four epitaxial layers positioned thereon. Laser radiation 21 generates photoluminescence 22 in the laser-active layer 2. This spontaneous emission, occurring at all locations of layer 2 struck by radiation 21, is received and analyzed with the aid of, for example, a mobile detector means 23. In this manner, it is not only ascertainable whether any photoluminescence occurs in layer 2 but, by scanning, it is also ascertained whether such photoluminescence exhibits sufficient uniformity of distribution regarding intensity and/or wavelength. These are all factors which are decisive in terms of quality in a completed laser diode. In this manner, a rational selection can be made to complete only such laser diodes which have, for example, a very specific wavelength of emitted coherent laser radiation. Such specific wavelength laser diodes are useful for transmitting, in a light-conducting cable, signals and/or signal bands which are simultaneously carrier-frequency-modulated onto several light wavelengths.

The principles of the invention are applicable to substrate disks or laser diodes having a laser-active layer which, by way of comparison with the gallium-arsenide substrate, contain an aluminum concentration of, for example, greater than 2 mol % and preferably in the range of about 6 to 10 mol %. With this type of laser-active layer, the generated photoluminescent radiation 22 is of a much shorter wavelength in comparison to the spontaneous emission (simultaneously occurring via radiation 21) from the gallium-arsenide substrate), that radiation 22 is readily distinguishable from such spontaneous radiation from the substrate on the basis of different wavelengths alone.

A significant feature of the invention is the make-up of the earlier described additional or fourth layer 10 (which is technically provided per se for making good contact with contact 12), in regard to its material. This material has an aluminum concentration in gallium-arsenide such that a high transmittance exists for radiation 21 to be irradiated therein, generating the photoluminescence 22. Because the photoluminescence radiation 22 of layer 2 is equal in frequency to the subsequently generated laser radiation, the irradiated laser radiation 21, in order to stimulate the photoluminescence radiation, must have a somewhat shorter wavelength than radiation 22. Accordingly, the material forming layer 10 must have a transmittance to a wavelength region (from the direction of the long wavelength side), which extends beyond the wavelength region of the generated laser radiation.

A selection or restriction of transmittance to select wavelength regions is attained by controlling the material composition of the layers. For example, with a gallium-aluminum-arsenide having a 2 to 8 mol % aluminum concentration therein for layer 2, layer 10 must be formed of a gallium-aluminum-arsenide having at least 10 to 12 mol % aluminum concentration therein. However, the aluminum concentration in layer 10 should not exceed about 12 mol % to such an extent that unnecessary difficulties occur during the application of contact 12, such as would occur if contact 12 were directly applied onto layer 4 (which has an aluminum concentration of about 25 to 40 mol % and preferably about 35 mol %). When the material forming layer 10 has an aluminum concentration greater by about 4 mol %, relative to the aluminum concentration in the laser-active layer 2, such layer 10 or the material thereof, exhibits an energy band gap which is larger by about 2 kT than that of layer 2, at room temperatures.

In instances when the energy band gap of the additional layer 10 is larger by about 2 kT relative to that of laser-active layer 2, it will just suffice, with a prescribed operating temperature, to allow the monitoring laser radiation 21 (exciting the photoluminescence 22) to pass through layer 10 and into layer 2 without an interfering absorption. However, and preferably, a larger band gap difference of, for example, at least 5 kT, is provided by maintaining a difference of about 10 mol % aluminum concentration within the respective layers 10 and 2. This larger difference in aluminum concentration does not cause difficulties in application of a contact to the exterior surface of a layer 10 formed from such material. Further details for selection of appropriate aluminum concentration differences and the resulting band gap values can be ascertained from H. C. Casey, Jr., et al, "Heterostructure Lasers", Part A, Academic Press, 1978, pages 191–193.

The monitoring laser radiation 21 is preferably generated by a dye laser. Lasers of this type can be produced to generate laser radiation with selective wavelengths. The laser radiation 21 is preferably directed perpendicularly onto the exterior surface of a laser diode undergoing monitoring in accordance with the principles of the invention.

The principles of the invention have been described in relation to a gallium-aluminum-arsenide heterostructure laser, however, such principles are also applicable to other heterostructure laser diodes. For example, in a laser diode having a laser-active layer, similar to layer 2, composed of indium-gallium-arsenide-phosphide sandwiched between two high transmittance layers, similar to layers 4 and 6, having a high refractive index step, and which are composed of indium phosphide, application of a contact to such indium-phosphide surfaces is difficult. Accordingly, an additional layer, similar to layer 10, but composed of indium-gallium-arsenide-phosphide, must be utilized. The principles of the invention for selecting the gallium and arsenide components in the earlier discussed gallium-aluminum-arsenide heterostructure laser, are utilized for a corresponding selection of gallium and arsenide in the indium-gallium-arsenide-phosphide laser in the laser-active layer and the additional layer. In the just described laser diode (indium-gallium-arsenide-phosphide), care must be taken to insure that the varying gallium-arsenide components, necessary to achieve a difference of at least 2 kT in the respective band gaps of the layers, does not cause excessively varying grading constants for epitaxial deposition. In the earlier described exemplary laser diode (gallium-aluminum-arsenide) problems relating to grading constants of the individual epitaxial layers on a gallium-arsenide substrate do not occur.

In accordance with the principles of the invention, the upper boundary surface of the additional or fourth layer 10, on which a contact 12 is to be applied, is as plane as possible so that a specular surface for radiation of the laser wavelength generated in layer 2 results. Generally, this is attained by conventional epitaxial deposition. With this feature an added advantage is attained in that stray radiation emitting from laser-active layer 2 into layer 4, because of insufficient total reflection, is not absorbed by the additional layer but is reflected back on its surface 11 or, respectively, on a lower surface of contact 12 and returned to layer 2. A regain of radiation energy is thus achieved and enters positively into the balance for repopulation in laser-active layer 2. The conditions here are advantageously such that any stray radiation from laser-active layer 2 primarily passes to adjacent layer 4 and much less to layer 6. This is based on the fact that the boundary surface between the first layer 6 (positioned directly on the gallium arsenide substrate 8) and the laser-active layer 2 is extremely smooth due to epitaxial deposition, particularly liquid-phase epitaxy deposition, whereas the boundary surface between the layer 2 and the cover layer 4, disposed thereon, is relatively rough. An epitaxial layer transition between a gallium arsenide having a high aluminum concentration to one having a low aluminum concentration, according to experience, is substantially smoother than a corresponding transition from a gallium arsenide having a low aluminum concentration to one having a high aluminum concentration, such as between layers 2 and 4. The necessary sub-substrate contact is designated 112.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. In a laser diode comprised of a multi-layer structure having a cover layer (4) for total reflection of radiation generated in a laser-active layer (2), said cover layer (4) being composed of a material which is transparent to said generated radiation, said laser-active layer (2) being positioned below and in contact with said cover layer (4), and an additional layer (10) positioned on top of said cover layer (4) and supporting a contact (12) on an exterior surface (11) thereof, the improvement comprising wherein:
    said additional layer (10) is composed of a semiconductor material having a band gap which is greater by at least 2 kT relative to that of the material forming said laser-active layer (2); and
    said additional layer (10) having an exterior surface (11) which is substantially specularly smooth for radiation generated in said laser-active layer (2).

2. In a laser diode as defined in claim 1 wherein said band gap of said semiconductor material forming said additional layer is at least 5 kT greater than that of the material forming said laser-active layer.

3. In a laser diode as defined in claim 1 wherein said laser-active layer is composed of a material having the formula:

$$Ga_{1-x}Al_xAs$$

wherein x is a numeral greater than zero, and said additional layer is composed of a material having the formula:

$$Ga_{1-x'}Al_{x'}As$$

wherein x' is a numeral greater than 0.04 but smaller than the amount of aluminum in said cover layer located between said additional layer and said laser-active layer.

4. A multi-layer laser diode structure comprising, in combination,
    a substrate composed of gallium-aluminum-arsenide containing about 2 to 12 mol percent of aluminum therein;
    a first layer positioned directly on said substrate and being composed of gallium-aluminum-arsenide containing about 25 to 40 mol percent of aluminum therein;
    a laser-active layer positioned directly on said first layer and being composed of gallium-aluminum-arsenide containing about 6 to 8 mol percent of aluminum therein;
    a second layer positioned directly on said laser-active layer and being composed of gallium-aluminum-arsenide containing about 25 to 40 mol percent of aluminum therein; and
    an additional layer positioned directly on said second layer and being composed of gallium-aluminum arsenide containing about 10 to 12 mol percent of aluminum therein, with a contact being positioned directly on an exterior surface of said additional layer.

5. A multi-layer laser diode structure as defined in claim 4, wherein said first and second layers contain about 35 mol percent of aluminum therein, said laser-active layer contains about 8 mol percent of aluminum therein and said additional layer contains no more than about 12 mol percent of aluminum therein.

6. A multi-layer laser diode structure as defined in claim 5, wherein said additional layer contains about 10 mol percent of aluminum therein.

* * * * *